United States Patent [19]

Gobrecht et al.

[11] Patent Number: 4,764,249
[45] Date of Patent: Aug. 16, 1988

[54] METHOD FOR PRODUCING A COATING LAYER FOR SEMICONDUCTOR TECHNOLOGY AND ALSO USE OF THE COATING LAYER

[75] Inventors: Jens Gobrecht, Gebenstorf; Jan Voboril, Nussbaumen, both of Switzerland

[73] Assignee: BBC Brown, Boveri Ltd., Baden, Switzerland

[21] Appl. No.: 26,481

[22] Filed: Mar. 16, 1987

[30] Foreign Application Priority Data

Mar. 18, 1986 [CH] Switzerland .................... 1091/86

[51] Int. Cl.$^4$ .................. B44C 1/22; C03C 15/00; C03C 25/06
[52] U.S. Cl. .................... 156/643; 156/644; 156/646; 156/655; 156/657; 156/659.1; 156/668; 204/192.37; 252/79.1; 437/157; 437/228; 437/238
[58] Field of Search ............... 156/643, 644, 646, 653, 156/655, 656, 657, 659.1, 662, 668; 204/164, 192.32, 192.37; 427/38, 39; 252/79.1; 148/1.5, 187; 437/157, 158, 228, 238

[56] References Cited

U.S. PATENT DOCUMENTS

| 4,256,532 | 3/1981 | Magdo et al. ............... 156/657 X |
| 4,461,672 | 7/1984 | Musser ............................ 156/644 |
| 4,484,978 | 11/1984 | Keyser ............................ 156/643 |
| 4,661,203 | 4/1987 | Smith et al. ................... 156/643 |

FOREIGN PATENT DOCUMENTS

0001038 3/1979 European Pat. Off. .

OTHER PUBLICATIONS

Rothman et al., "Process for Forming Tapered Vias in SiO$_2$ by Reactive Ion Etching", Extended Abstracts, vol. 80-1 (1980 May), Abstract No. 110, pp. 289-290.
Koste et al., "Via Profiling by Plasma Etching with Varying Ion Energy", IBM Technical Disclosure Bulletin, vol. 22, No. 7, Dec. 1979, pp. 2737-2738.
Tove, "Methods of Avoiding Edge Effects on Semiconductor Diodes", Review Article, J. Phys. D: Appl. Phys., 15(1982), pp. 517-536.
Tihanyi, "Integrated Power Devices", IEDM-82, pp. 6-10.
Stengl et al., "Variation of Lateral Doping-A New Concept to Avoid High Voltage Breakdown of Planar Junctions", IEDM-85, pp. 154-157.
Ephrath, "Dry Etching for VLSI-A Review", J. Electrochem. Soc.: Reviews and News, Mar. 1982, vol. 129, No. 3, pp. 62C-65C.

*Primary Examiner*—William A. Powell
*Attorney, Agent, or Firm*—Oblon, Fisher, Spivak, McClelland & Maier

[57] ABSTRACT

A coating layer (2) for semiconductor technology having an edge contour which has a wedge-shaped cross section is produced by predominantly anisotropic dry etching of the coating layer (2) through a mask (4) disposed in front of the coating layer (2) at a finite mask distance (A).

The coating layer (2) etched in this manner is especially well suited as an insulating substrate for a field plate in the edge region of a P-N junction emerging at the surface and also as implantation mask for producing a P-N junction with lateral doping gradients.

11 Claims, 2 Drawing Sheets

METHOD FOR PRODUCING A COATING LAYER FOR SEMICONDUCTOR TECHNOLOGY AND ALSO USE OF THE COATING LAYER

The present invention relates to a method for producing a coating layer for semiconductor technology according to the preamble of claim 1 and also the use of the coating layer produced by said method.

In virtually all semiconductor components whose function is based on the action of P-N junctions, there is the problem that said P-N junctions extend to the edge of the semiconductor substrate at some point. For various reasons this edge region is prone to electrical breakdowns if the P-N junction is polarized in the reverse direction.

In power semiconductors, which usually have to satisfy high requirements in relation to the reverse voltage, it is therefore necessary to reduce the electrical field at the P-N junction on the surface, which is synonymous with a widening of the space charge zone associated with the P-N junction.

The following have been successful as the most common methods of widening the space charge zone:
- the geometrical modification of the edge of the component in the form of a bevel with a positive or negative angle, in the form of a trench etc.,
- the electrical internal modification of the edge region in the form of guard rings, field plates etc.,
- a combination of the two methods.

An overview of these known methods for increasing the reverse voltage strength can be found in the article by P.A. Tove, J. Phys. D, 15 (1982), page 517 ff.

Compared with the internal electrical modification of the edge region, the first named method of mechanically machining the edge region has the disadvantage that, on the one hand, certain requirements relating to the depth of the P-N junction must be fulfilled, and on the other hand, the comparatively coarse mechanical processes are only poorly compatible with the other semiconductor technology processes. For these reasons it is desirable to have available a suitably adapted "electronic" edge contouring in the production of components.

It has now been proposed (J. Tihanyi in IEDM Tech. Digest 1982, page 6 ff.) that the electrical field in the edge region of a P-N junction emerging at the surface should be influenced by an Al field plate lying at an angle upon it and insulated by an $SiO_2$ layer. For such an inclined field plate, an $SiO_2$ layer with a wedge-shaped cross section is necessary onto which the field plate can be metallized.

This type of "electronic" edge contouring is indeed described in the said publication as a very simple and completely stable structure. At the same time, however, attention is drawn to the considerable disadvantage that the production of such a structure lying at an angle is very difficult.

The same opinion is also put forward in the article by P.A. Tove (page 524 in conjunction with FIG. 11) where the bevelling of the oxide layer is classified as difficult to achieve.

The object of the present invention is therefore to provide a method with which a coating layer can be produced in a simple manner which can be used in semiconductor technology, for example for a field plate lying at an angle, and which has an edge contour with a wedgeshaped cross section.

The object is achieved by the characterizing features of claim 1.

The essential feature of the invention is to use a predominantly anisotropically acting dry etching method, which has, however, at the same time always a non-vanishing isotropic component, for producing the contour with a wedge-shaped cross section. The said isotropic component comes to fruition in the form of a largely wedge-shaped underetching if the mask used in the etching process maintains an adequate mask distance from the coating layer to be etched.

Preferably, the method is carried out by means of a plasma etching process whose process parameters are so chosen that the etching proceeds in a predominantly anisotropic manner.

The thickness and the material of the coating layer, the mask distance and other quantities can be matched within wide ranges to the particular requirements imposed on the resultant coating layer. A mask distance in the range of 1 to 10 mm has proved successful.

The contoured coating layer produced by the method according to the invention can be used especially satisfactorily as an insulating substrate (in the form of an $SiO_2$ layer) for a field plate lying at an angle in the edge region of a planar, high reverse voltage P-N junction.

Further use relates to the production of a lateral doping gradient in the edge region of a planar, high reverse voltage P-N junction. Such a lateral doping gradient was hitherto produced by ion implantation by means of a mask with a very complicated structure (R. Stengl and U. Gösele, IEDM Tech. Digest, 1985, page 154 ff.); it is also a method of "electronic" edge contouring of a component.

The coating layer produced by the method according to the invention and having a bevelled edge can therefore be used in said ion implantation method in a particularly simple manner as an implantation mask, the doping profile produced continuously flattening out in the region of the bevelled edge and the desired lateral doping gradient thus being produced.

The invention will now be explained in more detail below in conjunction with the drawing and with reference to exemplary embodiments. In the drawing:

FIG. 1A-D: shows the essential steps in the structuring of a coating layer according to the prior art;

FIG. 2A-D: shows the essential steps in the structuring of a coating layer according to a preferred exemplary embodiment of the method according to the invention;

The sequence of figures FIG. 1A-1D shows the essential steps in a conventional structuring process for a coating layer. Starting from a semiconductor substrate 1 (FIG. 1A), a uniform continuous coating layer 2 (FIG. 1B), for example of $SiO_2$, is deposited on a surface of said substrate.

Figure 1A:
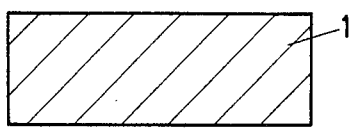
Figure 1B:
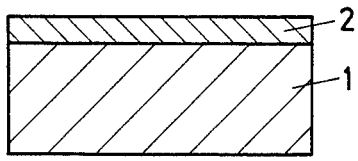
Figure 1C:
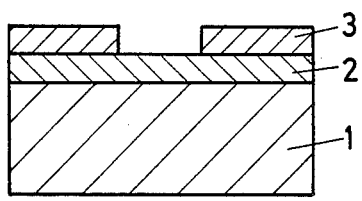
Figure 1D:
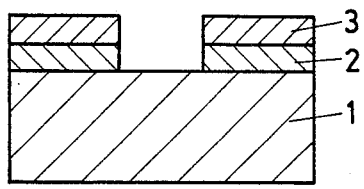

A mask layer 3 (FIG. 1C), which consists for example of photoresist and is structured in the desired manner by exposure and development, is then applied to said coating layer 2. In a subsequent, for example wet-chemical, etching process, the coating layer 2 is then removed at points which correspond to openings in the mask layer 3 (FIG. 1D).

Apart from a possible slight underetching of the edges of the openings in the mask layer 3, the edge contours of the regions etched away in the coating layer are largely sharp and undisturbed.

In contrast to this conventional method of structuring coating layers, in the method according to the invention the form of the removal process is precisely such that the edge contours in the coating layer have a special configuration, namely essentially a wedge-shaped cross section. The conventional abrupt transition between the coating layer of full thickness and the removed region is now replaced by a continuous gradual decrease in the layer thickness.

The essential steps of a preferred embodiment of the method according to the invention are shown in the sequence of figures FIG. 2A–2D. The coating layer 2 is applied to the semiconductor substrate 1 (FIGS. 2A and 2B) as in the conventional method (FIGS. 1A and 1B).

Figure 2A:
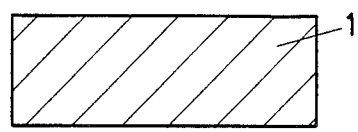
Figure 2B:
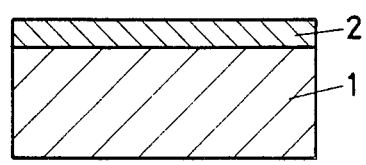
Figure 2C:
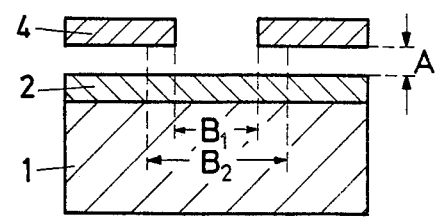
Figure 2D:
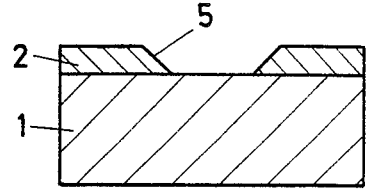

The form of the actual etching process is, however, essentially different (FIG. 2C). The mask layer 3 of the conventional method which is adjacent to the coating layer 2 (FIG. 1C) is now replaced, in the exemplary embodiment shown, by a mechanical mask 4 which is disposed parallel to the coating layer 2 at a finite mask distance A from the coating layer 2. The mechanical mask 4 may, for example, be a metal plate with a corresponding opening.

The purpose of the finite mask distance A is as follows: if the coating layer 2 is removed through the mechanical mask 4 by means of a predominantly anisotropically acting dry etching process, an anisotropic etching component and an unavoidable isotropic etching component are superimposed.

In a central region directly beneath the mask opening having a first width $B_1$, the anisotropic component of the etching, directed perpendicularly, predominates which leads to a removal of the coating layer 2 in this region corresponding to the conventional method.

Outside the central region, however, there is a second larger region having a second width $B_2$ in which the anisotropic component falls off and increasingly has an isotropic component superimposed on it. This superimposition results in a new attenuated etching attack which, as a result, leaves behind an edge contour 5 (FIG. 2D) in the coating layer 2 which falls off at an angle and which has the desired wedge-shaped cross section.

To influence the etching profile, i.e. in particular, the width of the wedge-shaped transition region in the coating layer 2, there are available, on the one hand, the mask distance A, but on the other hand, also the parameters of the dry etching method.

As the dry etching method, a plasma etching method of a type known per se (see, for example, L.M. Ephrath in J. Electrochem. Soc., Vol. 129, No.3 (1982), page 62C ff.), in which the process parameters can be chosen in an appropriate manner so that the etching acts predominantly anisotropically is preferably used. In this case, the etching profile can, for example, be influenced by the pressure of the etching gas or the autopolarization voltage.

Preferably, a coating layer 2 of $SiO_2$ is used on a semiconductor substrate 1 of Si. The etching is then carried out by means of an $SF_6$ plasma. To produce a wedge-shaped edge region 1 mm wide in an $SiO_2$ layer 1 μm thick, the following etching conditions have proved successful in practice:

| Etching gas: | $SF_6$ |
| --- | --- |
| Pressure: | 20 μbar |
| Flow: | 5 sccm (standard ccm) |
| HF power: | 150 W |
| Autopolarization voltage: | 800 V |
| Mask distance: | 1–10 mm |

Figure 5:
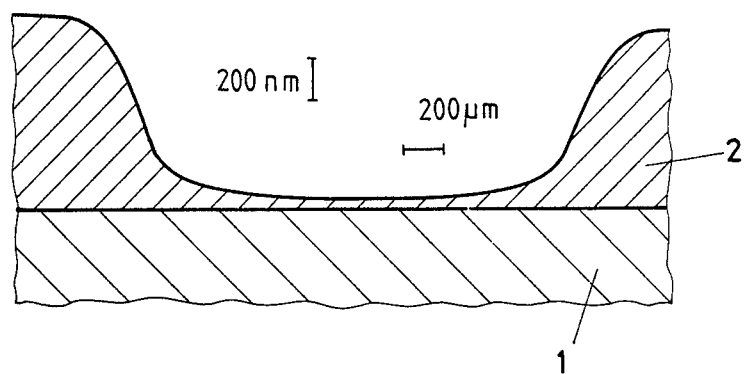
FIG. 5 shows the measured depth profile of a coating layer etched by the method according to the invention.

The measured etch depth profile of an $SiO_2$ coating layer structured under the abovementioned etching conditions with a mask distance A=2 mm is shown in FIG. 5. To clarify the situation in the edge region, the chosen scale in the Y direction (unit: 200 nm) in this representation has been magnified by the factor of 1000 compared with the scale in the X direction (unit: 200 μm).

If the coating layer 2 is chosen according to a further exemplary embodiment of the invention from photoresist or another polymer instead of $SiO_2$, an oxygen-containing plasma is used instead of a halogen-containing one.

Furthermore, it is possible to use with equal success a coating layer 2 of $Si_3N_4$ which can be etched away in the desired manner in an $SF_6$ plasma as also can be the $SiO_2$ layer.

The etching is likewise not restricted to an $SF_6$ plasma or an oxygen-containing plasma as etching plasma. On the contrary, a plasma consisting of a mixture of oxygen and a halogenated hydrocarbon, for example $CF_4$, can also be used for the method according to the invention.

Good results can, however, also be achieved with a halogen gas plasma.

Another exemplary embodiment of the method according to the invention should be explained with reference to FIGS. 6A and 6B. The mechanical mask 4 in FIG. 2C is replaced in the arrangement shown in FIG. 6A by a covering 6 which, although it is largely adjacent to the coating layer 2 as in the conventional method shown in FIG. 1C, has a special configuration in the region of the etched opening in the form of an overhang 9 situated at the edge of the etched opening. In this case the covering 6 may be either an adjacent mechanical mask or an applied mask layer.

Said overhang 9, which leaves a space clear between itself and the surface of the coating layer 2 and maintains in turn a finite mask distance A from the coating layer 2, fulfills the same function as the mechanical mask 4 in FIG. 2C with the difference that the isotropic etching beneath the mask is restricted laterally by the region in which the covering 6 is adjacent to the coating layer 2.

Figure 6A:
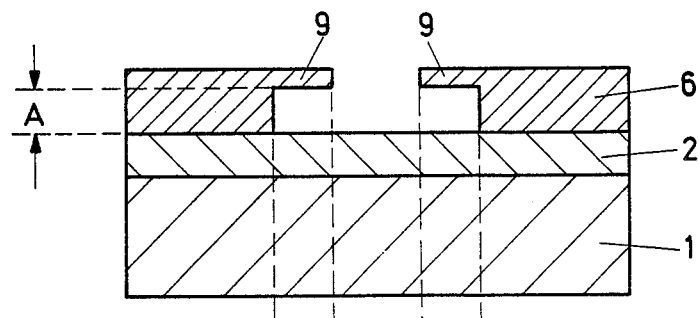
FIG. 6A shows a second preferred exemplary embodiment of the method according to the invention with lateral restriction of the bevelled edge contour.
Figure 6B:
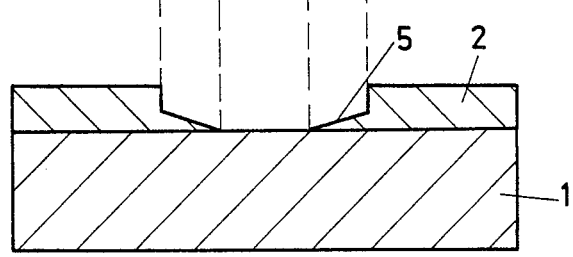
FIG. 6B shows the coating layer with lateral restriction produced by the method according to FIG. 6A.

The arrangement shown in FIG. 6A produces a coating layer with an edge contour as is shown in cross section in FIG. 6B. It can be seen clearly that in this case the wedge-shaped edge region is laterally bounded by a step. In this manner it is possible to produce in the coating layer 2 etched openings which, in addition to the wedge-shaped edge region, also have a defined lateral boundary.

All in all, according to the invention, it is possible to produce in an especially simple manner coating layers for semiconductor technology which have an edge contour with a wedge-shaped cross section, it being possible to influence the geometrical relationships in the edge contour in the desired manner by simple modification of the process parameters.

The coating layers produced by the method according to the invention can be used with special advantage in semiconductor technology in a field which is concerned with the reduction of the electrical field strength in the region of a P-N junction which emerges at the surface.

Figure 3:
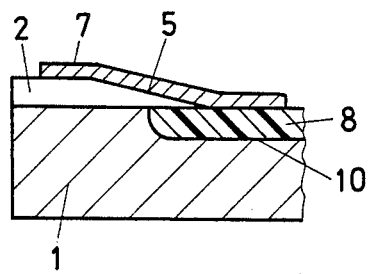
FIG. 3 shows the use of a covering layer produced by the method according to the invention as an insulating substrate of a field plate lying at an angle.

In one use the wedge-shaped edge region of the coating layer serves as an insulating substrate for a field plate 7 lying at an angle which is disposed above the P-N junction 10 which emerges at the surface and which is formed by a doping zone 8 and the semiconductor substrate 1 (FIG. 3). By applying a suitable potential to the field plate 7 the space charge zone of the P-N junction 8 at the surface, and consequently the electrical field strength, can in this case be modified in a known manner.

Figure 4:
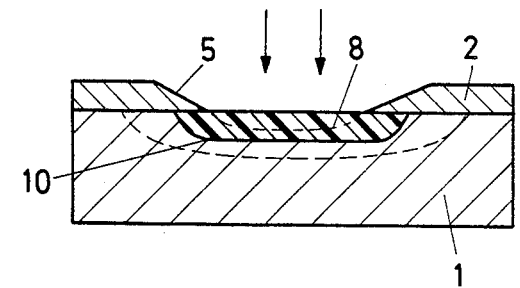
FIG. 4 shows the use of a coating layer produced by the method according to the invention as an implantation mask.

In another use (FIG. 4) the coating layer 2 with the wedge-shaped contour 5 serves as implantation mask in the ion implantation of a doping zone 8 with a lateral doping gradient. While the implantation in the central region of the opening results in a fully formed doping zone, it is increasingly hindered in the wedge-shaped edge region of the opening as the thickness of the layer increases so that a lateral gradient, which results in the desired widening of the space charge zone (shown by broken line in FIG. 4), is produced in this region.

In addition to the use of the coating layer 2 with wedge-shaped edge contour 5 as implantation mask in ion implantation, this type of masking can be successfully used in the same manner also in all other masked doping methods, for example diffusion from the gas phase, insofar as masking can be performed with $SiO_2$- or $Si_3N_4$- layers.

Consequently the coating layer produced according to the invention makes it possible to construct semiconductor components with improved reverse-bias properties in a very simple manner without recourse having to be made to technologically expensive masks or structuring methods.

We claim:

1. A method of producing a coating layer with apertures on a semiconductor substrate, whereby said apertures have wedge-shaped edges, said method comprising the steps of:
   covering said semiconductor substrate with a uniform coating layer;
   fabricating a mask with apertures which corresponds to said apertures to be produced in said coating layer;
   disposing said mask at a mask distance of between 1 and 10 mm above said coating layer; and
   etching said coating layer apertures through said mask apertures by means of a predominantly anisotropical dry etching method.

2. The method as claimed in claim 1, wherein said dry etching method is a plasma etching method.

3. The method as claimed in claim 2, wherein the coating layer (2) consists of $SiO_2$ or $Si_3N_4$ and an $SF_6$ plasma is used for the etching.

4. The method as claimed in claim 2, wherein the coating layer (2) consists of a photoresist or another polymer and an oxygen-containing plasma is used for the etching.

5. The method as claimed in claim 3, wherein the etching is carried out at a pressure of about 20 $\mu$bar, a gas flow of about 5 standard ccm, and HF power of about 150 W and an autopolarization voltage of about 800 V.

6. The method as claimed in claim 2, wherein a plasma consisting of a mixture of oxygen and a halogenated hydrocarbon is used for the etching step.

7. The method as claimed in claim 2, wherein a halogen gas plasma is used for the etching.

8. The use of a coating layer produced by the method as claimed in claim 1 as a mask in a masked doping process, in particular as implantation mask in ion implantation for producing a lateral doping gradient in the edge region of a planar, high reverse voltage P-N junction (10).

9. The method as claimed in claim 1, wherein a mechanical mask which maintains the mask distance (A) over the entire mask area from the coating layer (2) is used as mask (4).

10. The method as claimed in claim 1, wherein an overhang (9), which is removed from the coating layer (2) by the mask distance (A), in the opening of a covering (6) adjacent to the coating layer (2) is used as mask.

11. The use of a coating layer produced by the method as claimed in claim 1 as an insulating substrate for a field plate (7) lying at an angle in the edge region of a planar, high reverse voltage P-N junction (10).

* * * * *